(12) United States Patent
Kussmaul

(10) Patent No.: US 6,330,264 B1
(45) Date of Patent: Dec. 11, 2001

(54) SIGNAL BAND ANTIREFLECTION COATING FOR PUMP FACET IN FIBER AMPLIFIER SYSTEM

(75) Inventor: Andreas Kussmaul, Lexington, MA (US)

(73) Assignee: Corning Lasertron, Inc., Bedford, MA (US)

( * ) Notice: Subject to any disclaimer, the term of this patent is extended or adjusted under 35 U.S.C. 154(b) by 0 days.

(21) Appl. No.: 09/232,551

(22) Filed: Jan. 18, 1999

(51) Int. Cl.$^7$ ........................................ H01S 5/00
(52) U.S. Cl. .................. 372/49; 372/6; 372/29.02; 372/31; 372/75
(58) Field of Search ............. 385/38; 372/6, 372/29.02, 31, 49, 75, 102

(56) References Cited

U.S. PATENT DOCUMENTS

| | | | |
|---|---|---|---|
| 4,358,851 | 11/1982 | Scifres et al. | 372/97 |
| 4,942,585 | * 7/1990 | Ungar | 372/44 |
| 5,659,644 | * 8/1997 | DiGiovanni | 385/31 |
| 5,668,049 | 9/1997 | Charkrabarti et al. | 438/33 |
| 5,721,636 | 2/1998 | Erdogan et al. | 359/341 |
| 5,870,417 | * 2/1999 | Verdiell | 372/32 |
| 6,012,853 | * 1/2000 | Pan | 385/88 |

FOREIGN PATENT DOCUMENTS

| | | | |
|---|---|---|---|
| 0 843 393 A2 | 5/1998 | (EP) | H01S/3/19 |
| 0 991 153 A1 | 4/2000 | (EP) | H01S/3/18 |
| WO 93/18561 | 9/1993 | (WO) | H01S/3/06 |
| WO 97/39460 | 10/1997 | (WO) | H01C/3/06 |

OTHER PUBLICATIONS

Giles, C.R., et al., "Simultaneous Wavelength–Stabilization of 980–nm Pump Lasers," *8342 IEEE Photonics Technology Letters*, pp. 907–909 (Aug. 1994).

B.S. Bhumbra, et al., "Improvements in the Wavelength Stability of Evaporated $TiO_2/SiO_2$ Anti–Reflection Coatings by Ion Assistance," *J. Vac. Sci. Technol. B*, vol. 13, No. 3, pp. 881–888 (May/Jun. 1995).

H.A. Macleod, "Antireflection Coatings", *Thin Film Optical Fibers*, 2nd Ed., pp. 72–85 (1986).

G.P. Agrawal, et al., *Semiconductor Lasers*, (2nd Edition), p. 60 (1995).

J. Lee, et al., "Broadband Double–Layer Antireflection Coatings for Semiconductor Laser Amplifiers," *Jpn. J. Appl. Phys.*, vol. 36, Part 2, No. 1A/1B, pp. L52–L54 (Jan. 15, 1997).

H.A. Macleod, "Antireflection Coatings for Two Zeros", *Thin Film Optical Fibers*, 2nd Ed., pp. 123–131 (1986).

\* cited by examiner

Primary Examiner—James W. Davie
Assistant Examiner—Gioacchino Inzirillo
(74) Attorney, Agent, or Firm—Hamilton Brook Smith Reynolds, P.C.

(57) ABSTRACT

A laser diode pump for fiber amplifiers, such as erbium-doped fiber amplifiers (EDFAs), reduces spurious reflections in the signal frequencies by providing a laser pump system that is dissipative at these signal frequencies. Reflections from the pump system are reduced, or eliminated by using an output facet that is currently coated to be reflective at pump frequencies, but anti-reflective, or transmissive, at the signal frequencies. In one embodiment, material layers of aluminum oxide ($Al_2O_3$), titanium dioxide ($TiO_2$), and silicon dioxide ($SiO_2$) are used.

30 Claims, 4 Drawing Sheets

SIGNAL BAND ANTIREFLECTION COATING FOR PUMP FACET IN FIBER AMPLIFIER SYSTEM

BACKGROUND OF THE INVENTION

Rare-earth-doped fiber amplifiers have been increasingly deployed in fiber optic signal transmission systems. Previously, over long distance fiber optic transmission links, the optical signal was detected at periodic distances by an opto-electronic detector, converted into an electrical signal, which was then used to drive a laser diode to in effect regenerate the optical signal for retransmission over the next section of the link. The distance between these opto-electronic systems was dictated by the attenuation at the signal frequencies of the fiber, and if any one of these opto-electronic devices failed, the entire optical transmission link failed. With the advent of fiber amplifiers, the distance between electro-optical devices changed from attenuation-limited to dispersion limited, however.

Under the model, the fiber amplifiers are distributed along the link to amplify the signal to counter its attenuation. Opto-electronic devices are only provided along the link at distances beyond which problematic chromatic dispersion and other effects would impair signal demodulation.

Another advantage associated with the use of fiber amplifiers in optical transmission links is related to their broad gain spectrum. This feature makes dense wavelength division multiplexed systems realistic since an amplifier can simultaneously amplify multiple channels traveling through the same optical fiber. Currently, WDM systems using fiber amplifier amplification have been deployed with 50–100 channels, with even larger channel systems being proposed.

The fiber amplifier systems require relatively few components. They comprise a rare-earth-doped fiber. Commonly, erbium-doped fiber amplifiers are used since they have a gain spectrum surrounding 1550 nanometers (nm), where there is a transmission window in commonly deployed fiber optic cabling. The fiber amplifier is anti-reflection coated at both its input and output facets to ensure that it behaves as an amplifier and not a laser, and isolators are also used, typically at the fiber output. Such fiber amplifiers are usually pumped by laser diode pumps, operating at 980 nm or 1480 nm have been used, but 980 nm pumping appears to becoming increasingly the standard due to certain stabilities in the fiber at this frequency and the laser diode availability. Clean signal amplification is further achieved by closely regulating the pump light. Typically, the pumps are tuned for temporal and spectral stability. Fiber grating stabilization is also used in some systems.

SUMMARY OF THE INVENTION

To further increase the amount of data carried by a single fiber and distances over which signal can be transmitted, noise inserted into the signal frequencies by the amplifier must be minimized. Even with pump stabilization and efforts to better anti-reflection coat the fiber amplifier's facets, the noise in the fiber amplifier system is still not insubstantial. Research has shown that some of this noise results from spurious reflections at the signal frequencies in the laser pump systems. Light originating in the optical fiber leaks into the fiber pigtails and is apparently reflected by the pump laser's output facets to return back to the fiber amplifier where it is now substantially out-of-phase with the optical signal, thus contributing to the noise figure.

The present invention resolves these spurious reflections by providing a laser pump system that is dissipative at the signal frequencies. Thus, spurious reflections at the signal frequencies from the laser pumps are reduced into the fiber amplifier.

In general, according to one aspect, the invention features a wavelength division multiplexing system. This system features a fiber amplifier, which amplifies at signal frequencies of wavelength-separated channels, and a pump system. The pump system comprises a laser pump in which the output facet is coated to be anti-reflective, or transmissive, at the signal frequencies. The pump system further comprises a fiber pigtail having a micro-lens for collecting light from the laser pump and transmitting the pump light to the fiber amplifier.

Finally, according to still another aspect, the invention features a 980 nm laser diode comprising an output facet, which is transmissive at approximately 1550 nm.

The above and other features of the invention including various novel details of construction and combinations of parts, and other advantages, will now be more particularly de:scribed with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
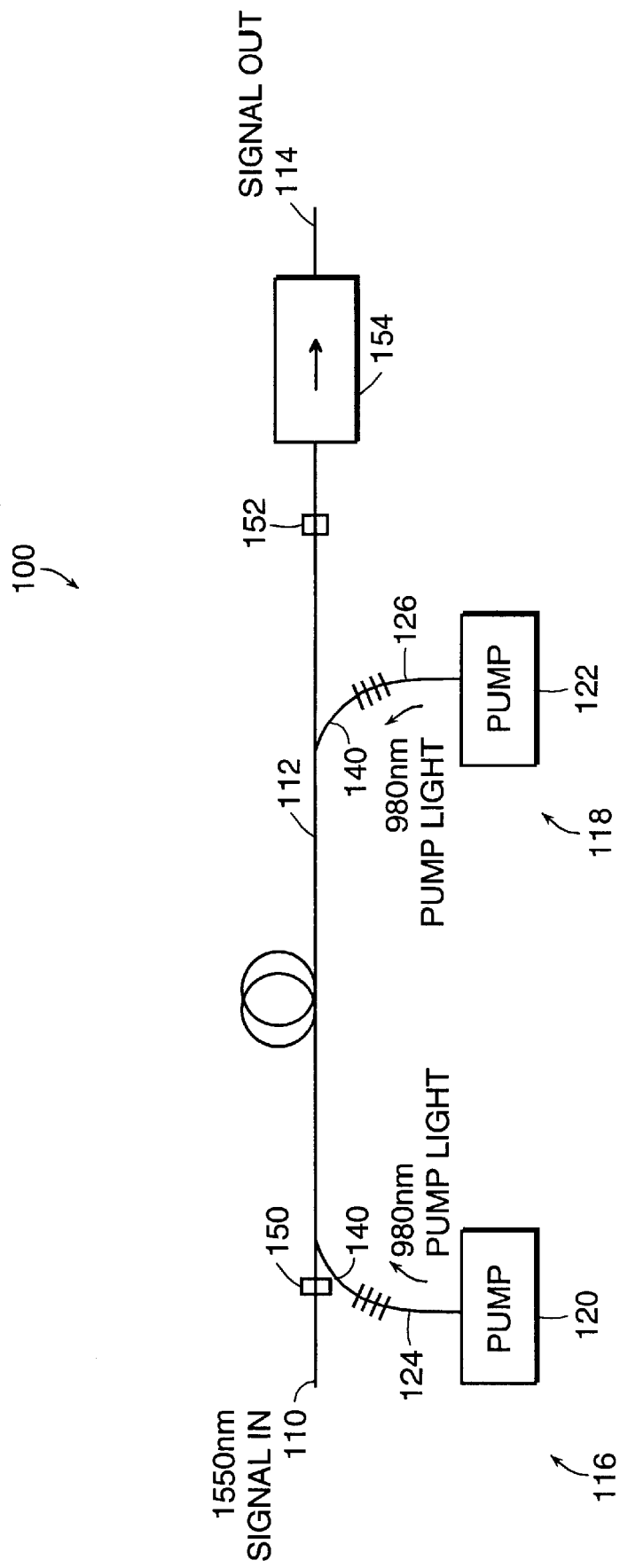
FIG. 1 is a schematic block diagram of a fiber amplifier system for a wavelength division multiplexed system as is conventional in the art.

FIG. 1 shows a fiber amplifier system 100 in which the present invention is implemented.

The fiber amplifier system 100, in one implementation, operates in a wavelength division multiplexing system. In this context, the signal-in 110 comprises multiple channels such as 50–100, operating at different, but typically closely spaced carrier frequencies. For example, channel spacings of 50–100 GHz is common. These channels are collectively amplified as signal-out 114 by the fiber amplifier 112 for transmission typically to the next fiber amplifier or a detector system.

In the preferred embodiment, the fiber amplifier 112 is an erbium-doped fiber, which amplifies signal frequencies at approximately 1550 nm. Specifically, in currently available erbium fiber amplifiers, the gain spectrum extends from about 1510 to 1630 nm.

In the illustrated embodiment, the fiber amplifier 112 is pumped by laser diode pump systems 116, 118. Each of these pump systems comprises a laser diode pump 120, 122. These pumps 120, 122 couple light into respective fiber pigtails, 124, 126, which transmit the light to the fiber amplifier 112. Spurious reflections from downstream are reduced by an isolator 154.

Although two pumps are shown, which transmit light in different directions along the fiber amplifier, toward each other, other pumping arrangements are known and this invention is applicable to them. For example, single pumps or multiple pump systems can be used working either with or counter to the direction of signal light transmission along the fiber amplifier.

Figure 2:
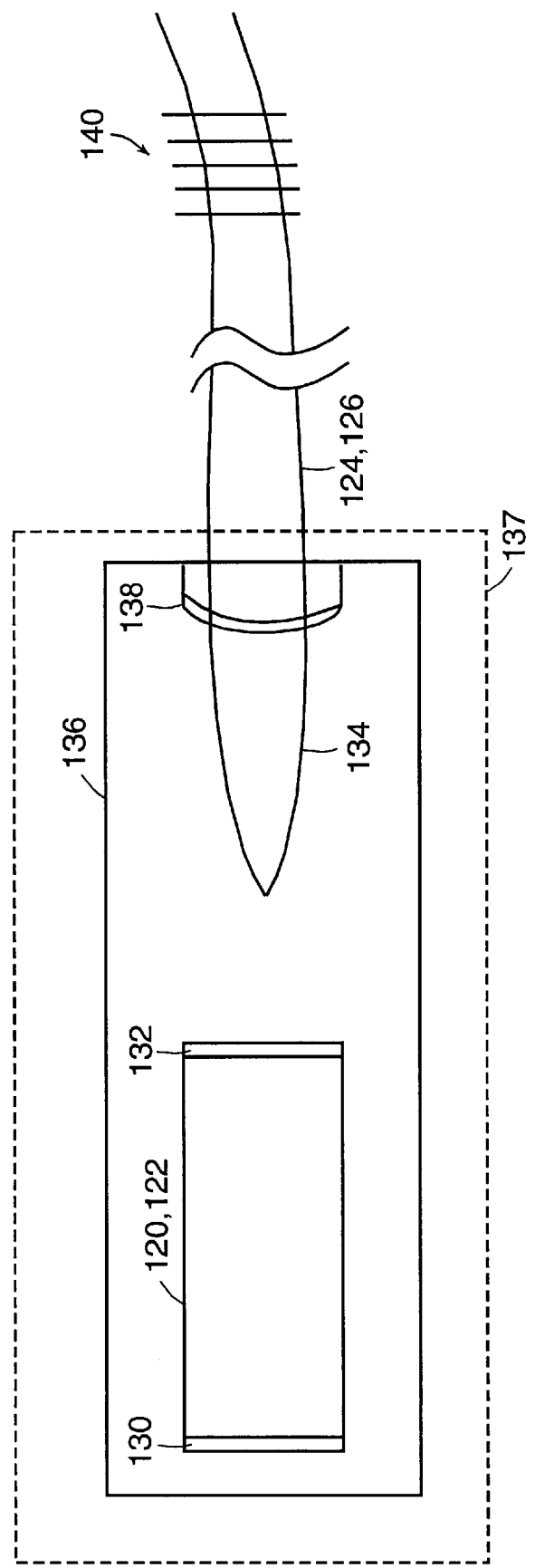
FIG. 2 shows a pump laser system for the fiber amplifier system according to the present invention.

FIG. 2 shows the general construction of the laser diode pump systems 116, 120 in an embodiment of the present invention. The laser diode pump 120, 122 usually is a Fabry-Perot-type laser (simple cavity). Under current technology the injection lasers couple 50 to over 100 milliWatts (mW), to as high as 200 mW, or higher, of output light into a pigtail.

In order to provide laser operation, a resonant cavity must be created. In the present embodiment, the rear facet 130 and output facet 132 of the laser diode pumps 120, 122 have some reflectivity. Typically, the rear facet 130 is totally reflecting, i.e., approximately 90%. The front or output facet has a typically low reflectivity at the pump frequency of less than 10%.

In the preferred embodiment, a fiber grating 140 is also used to generate additional feedback into pump 120, 122 and further tune its spectrum. When such a external grating is used, less reflectivity at the front facet is tolerated. In the preferred embodiment, front facet reflectivity is 3 to 4% at the pump frequency of 980 nm, but in extreme cases, all or effectively all of the laser feedback is provided by the fiber grating 140. In these instances, the reflectively of the front or output facet 132 is as low as 0% or near completely transmissive at the pump frequency of 980 nm.

Light exiting from the output facet 132 of the pump 120 is coupled into the fiber pigtail 124, 1263. In the preferred embodiment, a micro-lens 134 is formed at the proximal end of the fiber pigtail 124, 126. The pigtail is secured to a submount 136, via a clip 138 or other appropriate technique such as reflow soldering, mutually with the laser diode 12C, 122. The submount 136 is secured in a module 137 for environmental protection. The mutual position of the micro-lens 134 and pump output facet 132 is arranged to maximize the coupling efficiency of the light generated and emitted from the laser diode into the fiber pigtail 124, 126. In the preferred embodiment, the micro-lens is configured and manufactured as described in U.S. patent application Ser. No. 8/965,798, filed Nov. 7, 1997, entitled FLAT TOP, DOUBLE ANGLED, WEDGE-SHAPED FIBER ENDFACE, the teachings of which are incorporated herein in their entirety by this reference.

Other chip-to-fiber coupling schemes are known and applicable, such as butt-coupling and micro-bead approaches, for example. Also, there are many techniques for micro-lens formation such as etching techniques, wedge-shaped polishing, and multi-angle polishing, and fusing, for example. The commonality is that light at the signal frequencies is reflected from the front facet and coupled back into the fiber to some degree.

It is theorized, however, that attempts to improve the coupling efficiency between the laser diode 120, 122 and the fiber pigtail 124, 126 also exacerbate spurious reflections at the signal frequencies by the pump systems 116, 118 into the amplifier 112. Light at the signal frequencies, originating in the fiber amplifier 112 is transmitted down the fiber pigtails 124, 126 counter to the principal direction of the pump light, and focused by the micro-lens 134 onto the output facet 132 of the laser diode 120, 122. In the prior art, where this facet is reflecting at the signal frequencies, the stray light at the signal frequencies is coupled back into the fiber pigtail 124, 126 and transmitted to the amplifier. This stray light is now out-of-phase with the signals received into the amplifier, thereby contributing to its noise figure. This effect tends to be exacerbated in the dual pumping scenario illustrated in FIG. 1, where the stray light at the signal frequencies is reflected back and forth between pumps 120 and 122 multiple times and amplified by the amplifier 112.

In the present invention, the pump systems are made to be dissipative at the signal frequencies. This is accomplished in the preferred embodiment tuning the reflectivity of the front facet of the laser diode to be transmissive at signal frequencies.

Figure 3:
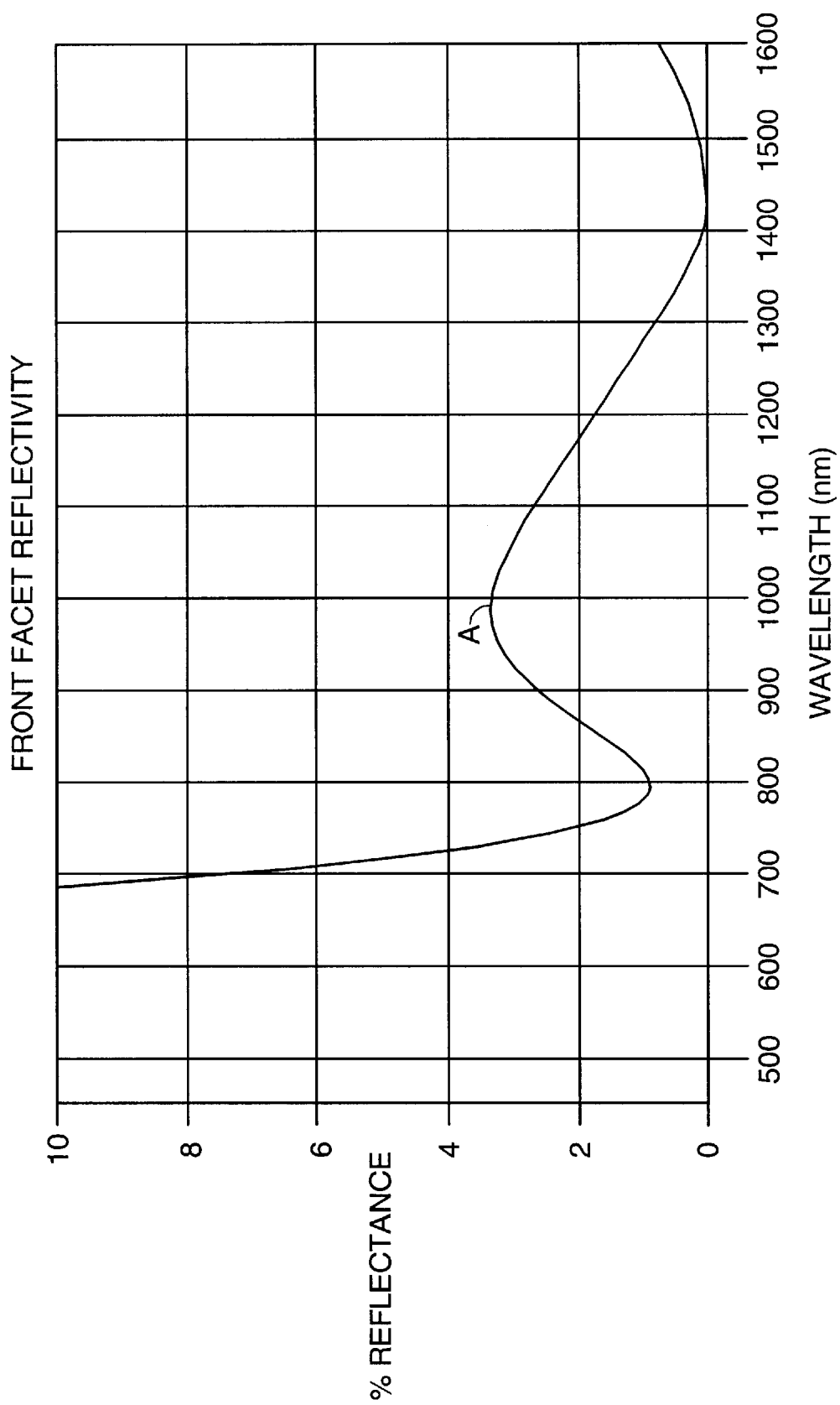
FIG. 3 is a plot front facet reflectivity as a function of wavelength for the laser diode pump according to the present invention.

FIG. 3 is a plot of front facet reflectivity, in percent reflectance, as a function of wavelength for the output facet 132 of laser diode pumps, which have been constructed according to the principles of the present invention. The facet reflectivity is preferably what is termed a "W" spectrum with a local maximum and local minimums located on either side of the central peak. In the present embodiment, the local maxima of the "W" spectrum's center peak (A) is located near or at the center frequency of the laser pump 120, 122. The reflectance of the facet coating is configured to decrease with increasing wavelength so that the reflectivity is at or near a minimum at approximately 1550 nm, or the signal frequencies.

In the illustrated example, the percent reflectance at 1550 is less than 1% and closer to one-half percent, although a reflectance of less than 3% still provides advantages. The reflectance peaks at approximately 2–3%, specifically approximately 2.3% at 980 nm. Generally, however, the reflectance at this wavelength can range between 1 and 10%.

In the case of pump with a fiber grating as illustrated in FIGS. 1 and 3, the reflectance of the laser pump ranges as low as 0% in the present invention. In such cases, the fiber grating provides all or most of the necessary feedback for the laser operation of the pumps 120, 122.

In any case, it is the behavior of the front facet at the signal frequencies that enables the invention to suppress noise in the amplifier 112. Apparently, the transmissivity of the front facet at the signal frequencies allows the stray light from the amplifier 112 to enter the pump's semiconductor cavity. Since the cavity is poorly optimized for guiding light at frequencies other than surrounding 980 nm, the 1550 light is not coupled back into the fiber pigtail 124, 126. Thus, the pump systems 116, 118 are with the selectively transmissive output facet coating is dissipative at the signal frequencies.

Figure 4:
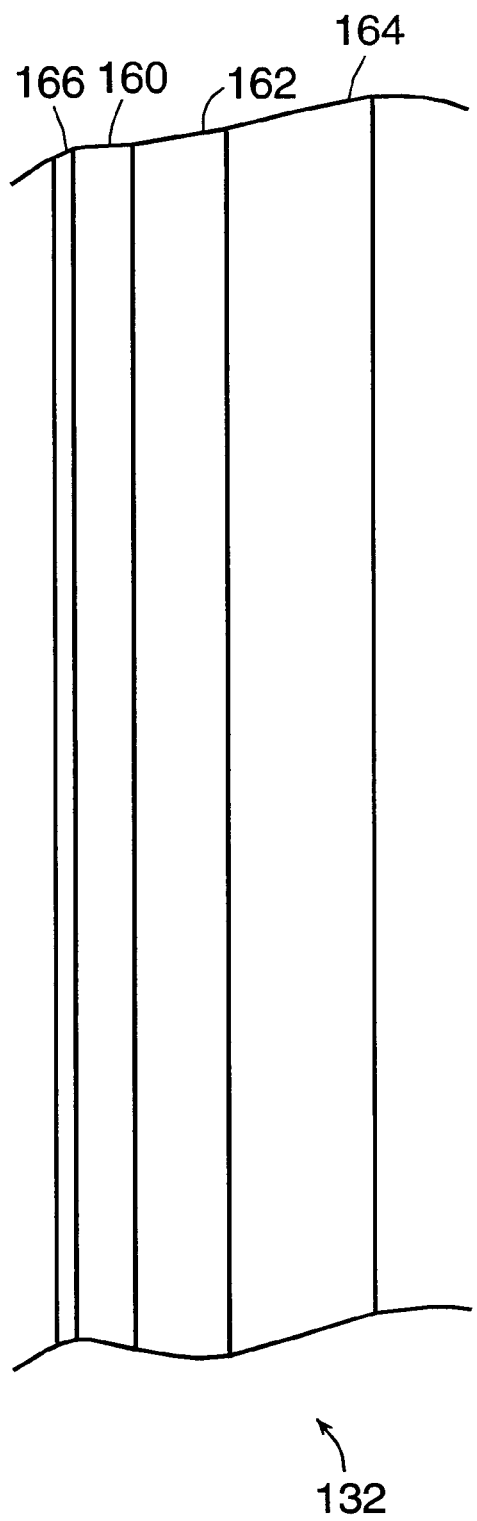
FIG. 4 is a schematic diagram illustrating the front facet coating according to one embodiment of the present invention.

FIG. 4 shows the coating used for the output facet 132 according to a current embodiment of the invention.

The output facet coating comprises a layer of aluminum oxide ($Al_2O_3$) 160 (index ~1.6, thickness of approximately 250 Angstroms (Å)), followed by a layer of titanium dioxide ($TiO_2$) 162 (index ~2.35, thickness 770 Å), followed by a layer of silicon dioxide ($SiO_2$) 164 (index ~1.47, thickness 1700 Å). This design is a modification of a quarter wave-quarter wave design, where the indices of the layers are chosen so that $n_1$, $n_2$, ~$n_s$, where $n_s$ is the substrate index, $n_1$ is the index of the top layer, and $n_2$ is the index of the layer in contact with the substrate. This condition on the indices allows for the characteristic double minimum ("W") structure. Aluminum oxide layer 160 is added to the design as the layer directly in contact with the substrate, which allows turning of the reflectivity at 980 nm by adjustment of the thickness of the layer to effect the local maximum.

In addition to the optical coatings, manufacturers often add an extremely thin (optically inactive at the pump and signal frequencies) passivation layer 166, such as silicon.

In alternative embodiments, a 10% reflectance at 980 nm is achieved by using the following sequence of layers: 620 Å aluminum oxide ($Al_2O_3$) layer, 500 Å a titanium dioxide ($TiO_2$) layer, and 1670 Å silicon dioxide ($SiO_2$) layer.

A lower reflectance than 2% is achieved in still other embodiments by making all the layers slightly thicker so as to shift the minimum to the left of 980 nm towards 980 nm. It is also possible to reduce the peak reflectance by making the initial $Al_2O_3$ layer thinner.

While this invention has been particularly shown and described with references to preferred embodiments thereof, it will be understood by those skilled in the art that various changes in form and details may be made therein without departing from the spirit and scope of the invention as defined by the appended claims. For example, other material layer and thicknesses will provide the necessary reflectivity at 980 nm, or pump frequencies, and transmissivity at 1550 nm, or the signal frequencies.

What is claimed is:

1. A laser pump system for a fiber amplifier that is dissipative of light at signal frequencies originating from the fiber amplifier to reduce spurious back reflections at the signal frequencies from the laser pump back into the fiber amplifier, the laser pump system comprising a laser pump in which an output facet is coated to be anti-reflective at the signal frequencies.

2. A laser pump system as described in claim 1, comprising a fiber pigtail for transmitting pump light to the fiber amplifier.

3. A laser pump system as described in claim 1, wherein pump frequencies are at approximately 980 nm and the signal frequencies are at approximately 1550 nm.

4. A laser pump system as described in claim 1, comprising a laser pump in which an output facet is coated to be anti-reflective at pump frequencies.

5. A laser pump system as described in claim 1, comprising a laser pump in which an output facet is coated to be reflective at pump frequencies.

6. A laser pump system as described in claim 5, wherein a coating of an output facet of the laser pump has a "W" reflectance spectrum in the signal and pump frequencies.

7. A laser pump system as described in claim 5, wherein the coating of the output facet comprises a titanium dioxide and silicon dioxide layers.

8. A laser pump system as described in claim 5, wherein the coating of the output facet provides a reflectance of between 0 and 10% at pump frequencies and less than 3% at the signal frequencies.

9. A laser pump system as described in claim 7, wherein the coating of the output facet further comprises an aluminum oxide layer.

10. A laser pump system as described in claim 9, wherein the coating of the output facet further comprises a passivation layer.

11. A wavelength division multiplexing system, comprising:
    a fiber amplifier that amplifies at signal frequencies of wavelength-separated channels; and
    a laser pump system comprising:
        a laser pump in which an output facet is coated to be anti-reflective at the signal frequencies; and
        a fiber pigtail having a micro-lens for collecting light generated by the laser pump and transmitting pump light to the fiber amplifier.

12. A wavelength division multiplexing system as described in claim 11, wherein comprising at least two laser pumps pumping in opposite directions along the fiber amplifier.

13. A wavelength division multiplexing system as described in claim 11, further comprising an isolator at an output of the fiber amplifier.

14. A wavelength division multiplexing system as described in claim 11, wherein input and output facets of the fiber amplifier are antireflection coated at the signal frequencies.

15. A wavelength division multiplexing system as described in claim 11, wherein the signal frequencies are at approximately 1550 nm.

16. A wavelength division multiplexing system as described in claim 11, wherein the coating of the output facet has a "W" reflectance spectrum in the signal and pump frequencies.

17. A wavelength division multiplexing system as described in claim 11, wherein the coasting of the output facet provides a reflectance of between 0 and 10% at the pump frequencies and less than 3% at the signal frequencies.

18. A wavelength division multiplexing system as described in claim 11, wherein the coating of the output facet provides a reflectance at pump frequencies.

19. A wavelength division multiplexing system as described in claim 11, wherein the coating of the output facet comprises titanium dioxide and silicon dioxide layers.

20. A wavelength division multiplexing system as described in claim 12, wherein the laser pumps transmit light toward each other in the fiber amplifier.

21. A wavelength division multiplexing system as described in claim 15, wherein pump frequencies are at approximately 980 nm.

22. A wavelength division multiplexing system as described in claim 19, wherein the coating of the output facet further comprises an aluminum oxide layer.

23. A wavelength division multiplexing system as described in claim 22, wherein the coating of the output facet further comprises a passivation layer.

24. A 980 nm laser diode comprising an output facet having a coating which is greater than 95% transmissive at approximately 1550 nm.

25. A laser diode as described in claim 24, wherein a coating of an output facet of the laser diode has a "W" reflectance spectrum at the 980 to 1550 nm portion of the spectrum.

26. A laser diode as described in claim 24, wherein the coating of the output facet provides a reflectance of between 0 and 10% at 980 nm and less than 3% at 1550 nm.

27. A laser diode as described in claim 24, wherein a coating of the output facet comprises a titanium dioxide and silicon dioxide layers.

28. A laser diode as described in claim 25, wherein the coating of the output facet provides a reflectance of between 2 and 6% at 980 nm.

29. A laser diode as described in claim 27, wherein the coating of the output facet further comprises an aluminum oxide layer.

30. A laser diode as described in claim 27, wherein the coating of the output facet further comprises a passivation layer.

* * * * *